United States Patent
Zhang et al.

(10) Patent No.: US 10,795,478 B2
(45) Date of Patent: Oct. 6, 2020

(54) ARRAY SUBSTRATE AND PREPARATION METHOD THEREFOR, AND DISPLAY APPARATUS

(71) Applicant: BOE TECHNOLOGY GROUP CO., LTD., Beijing (CN)

(72) Inventors: Wenlin Zhang, Beijing (CN); Wei Yang, Beijing (CN); Ce Ning, Beijing (CN)

(73) Assignee: BOE TECHNOLOGY GROUP CO., LTD., Bejing (CN)

( * ) Notice: Subject to any disclaimer, the term of this patent is extended or adjusted under 35 U.S.C. 154(b) by 0 days.

(21) Appl. No.: 16/319,982

(22) PCT Filed: May 14, 2018

(86) PCT No.: PCT/CN2018/086697
§ 371 (c)(1),
(2) Date: Jan. 23, 2019

(87) PCT Pub. No.: WO2018/214774
PCT Pub. Date: Nov. 29, 2018

(65) Prior Publication Data
US 2019/0243497 A1    Aug. 8, 2019

(30) Foreign Application Priority Data

May 26, 2017   (CN) .......................... 2017 1 0386231

(51) Int. Cl.
*G06F 3/041* (2006.01)
*H01L 27/12* (2006.01)

(52) U.S. Cl.
CPC ........ *G06F 3/0412* (2013.01); *H01L 27/1218* (2013.01); *H01L 27/1225* (2013.01);
(Continued)

(58) Field of Classification Search
CPC ......... G06F 3/0412; G06F 2203/04103; H01L 27/1233; H01L 27/1225; H01L 27/1218;
(Continued)

(56) References Cited

U.S. PATENT DOCUMENTS 9,129,927 B2 *   9/2015   Gupta ................. H01L 27/3262
2009/0278121 A1 * 11/2009  Kakkad ............... G02F 1/13318
                                                            257/43
(Continued)

FOREIGN PATENT DOCUMENTS

CN      101577285 A      11/2009
CN      101635276 A       1/2010
(Continued)

OTHER PUBLICATIONS

International Search Report and Written Opinion dated Aug. 6, 2018.
Second Chinese Office Action dated Nov. 18, 2019.

*Primary Examiner* — Bryan Earles
(74) *Attorney, Agent, or Firm* — Dilworth & Barrese, LLP.; Michael J. Musella, Esq.

(57) ABSTRACT

Provided are an array substrate and preparation method therefor, and a display apparatus. The array substrate includes: a substrate, the substrate having a first TFT region, a touch control region and a second TFT region; a photosensitive PN junction, the photosensitive PN junction being provided in the touch control region; a first thin-film transistor, provided in the first TFT region, and electrically connected to the photosensitive PN junction; and a second thin-film transistor, provided in the second TFT region, and electrically connected to a pixel electrode.

13 Claims, 7 Drawing Sheets

(52) U.S. Cl.
CPC ...... *H01L 27/1233* (2013.01); *H01L 27/1259* (2013.01); *G06F 2203/04103* (2013.01)

(58) Field of Classification Search
CPC ............. H01L 27/1259; H01L 27/1251; H01L 27/1214
See application file for complete search history.

(56) References Cited

U.S. PATENT DOCUMENTS

| | | | | |
|---|---|---|---|---|
| 2011/0227878 | A1* | 9/2011 | Makita | H01L 27/1229 345/175 |
| 2011/0297936 | A1* | 12/2011 | Makita | H01L 27/14632 257/53 |
| 2013/0037815 | A1* | 2/2013 | Okajima | H01L 27/14678 257/59 |
| 2014/0299842 | A1* | 10/2014 | Kim | H01L 27/3262 257/40 |
| 2014/0340363 | A1* | 11/2014 | Ikeda | G06F 3/0412 345/175 |
| 2015/0243685 | A1* | 8/2015 | Lee | H01L 29/78675 257/43 |
| 2016/0247831 | A1* | 8/2016 | Makita | H01L 27/1274 |
| 2017/0123542 | A1 | 5/2017 | Xis et al. | |
| 2018/0210571 | A1 | 7/2018 | Wang et al. | |
| 2020/0091198 | A1* | 3/2020 | Peng | H01L 21/2652 |

FOREIGN PATENT DOCUMENTS

| | | |
|---|---|---|
| CN | 104009067 A | 8/2014 |
| CN | 104407726 A | 3/2015 |
| CN | 105514119 A | 4/2016 |
| CN | 105552085 A | 5/2016 |
| CN | 105867696 A | 8/2016 |
| CN | 107123654 A | 9/2017 |

* cited by examiner

ARRAY SUBSTRATE AND PREPARATION METHOD THEREFOR, AND DISPLAY APPARATUS

The application claims priority of the Chinese patent application No. 201710386231.4, filed on May 26, 2017, the entire disclosure of which is incorporated herein by reference as part of the present application.

TECHNICAL FIELD

Embodiments of the present disclosure relate to an array substrate, a manufacture method thereof, and a display apparatus.

BACKGROUND

Thin film transistors are widely used in the display field. New technologies such as oxide thin film transistors (Oxide TFTs) and low temperature polysilicon thin film transistors (LTPS) are continuously updated. Traditional semiconductor materials only function as a switch. Because the semiconductor materials have specific properties, they are applied in different fields. In order to reduce the thickness of the display apparatus, the known touch technology combined with the array substrate has been paid more and more attention, and the corresponding technologies such as IN Cell and On Cell continue to mature and are applied in various products. However, it is known that the display apparatus having a touch function requires an additional touch structure, so that it does not have high integration.

Therefore, the related technologies of the display apparatus with the touch function are still needed to be improved.

SUMMARY

Embodiments of the present disclosure provide an array substrate, integrated with a touch structure and having both of the touch and display functions and a smaller thickness, or having simple manufacturing processes and a simple structure.

An embodiment of the present disclosure provides an array substrate, comprising: a base substrate, having a first TFT region, a touch region, and a second TFT region; a PN junction, disposed in the touch region; a first thin film transistor, disposed in the first TFT region and electrically connected to the PN junction; a second thin film transistor, disposed in the second TFT region and electrically connected to a pixel electrode. A photosensitive PN junction structure that can be configured to touch sense is integrated to the array substrate, in order to have both of the touch and display functions at the same time, and the photosensitive PN junction structure is integrated onto the array substrate, in order to be capable of simplifying the product structure and manufacturing processes, and reducing the product thickness, which complies with the trend of being thinner and lighter.

According to the embodiment of the present disclosure, the first thin film transistor is a low temperature polysilicon thin film transistor, and the second thin film transistor is an oxide thin film transistor.

Another embodiment of the present disclosure provides a touch display apparatus, and the touch display apparatus comprises the array substrate of the above embodiment. The touch structure and the display structure of the touch display apparatus are integrated on the array substrate, and the product structure and the manufacturing processes are simple, and the thickness is small, which complies with the trend of being lighter and thinner.

Another embodiment of the present disclosure provides a manufacturing method of an array substrate, comprising: forming a first thin film transistor in a first TFT region of a base substrate; forming a photosensitive PN junction in a touch region of the base substrate; forming a second thin film transistor in a second TFT region of the base substrate; wherein the first thin film transistor is electrically connected to the photosensitive PN unction; the second thin film transistor is electrically connected to the pixel electrode. By the method, the photosensitive PN junction is integrated on the array substrate, so that the array substrate has both of the touch and display functions at the same time, and the manufacturing processes are simple and convenient and the cost is low.

According to an embodiment of the present disclosure, a second gate electrode of the second thin film transistor and a light shield layer of the first thin film transistor are formed by one patterning process and are located on a side of the base substrate; or the second gate electrode of the second thin film transistor and the first common electrode as well as a first gate electrode of the first thin film transistor are formed by one patterning process and are located on a side of the base substrate.

According to an embodiment of the present disclosure, the manufacturing method of the array substrate further comprises, forming a first insulation layer on the base substrate, wherein the first insulation layer covers the light shield layer and the second gate electrode, a portion of the first insulation layer located in the first TFT region constitutes a buffer layer of the first thin film transistor, and a portion of the first insulation layer located in the second TFT region constitutes a gate insulation layer of the second thin film transistor.

According to an embodiment of the present disclosure, the manufacturing method of the array substrate further comprises forming a second insulation layer on a side of the first insulation layer away from the base substrate, wherein the second insulation layer covers a first active layer of the first thin film transistor and a second active layer of the second thin film transistor, and a portion of the second insulation layer located in the first TFT region constitutes a gate insulation layer of the first thin film transistor, and a portion of the second insulation layer of the second insulation layer located in the second TFT region constitutes an etch stop layer of the second thin film transistor.

According to an embodiment of the present disclosure, the manufacturing method of the array substrate further comprises forming a third insulation layer on a side of the second insulation layer away from the base substrate, wherein the third insulation layer covers a first gate electrode of the first thin film transistor and the first common electrode, and a portion of third insulation layer located in the first TFT region constitutes an interlayer insulation layer of the first thin film transistor.

According to an embodiment of the present disclosure, a first electrode of the photosensitive PN junction, a first source electrode and a first drain electrode of the first thin film transistor, and a second source electrode and a second drain electrode of the second thin film transistor are formed by one patterning process and are located on a side of the third insulation layer far away from the base substrate.

According to an embodiment of the present disclosure, a second electrode of the photosensitive PN junction and a second common electrode are formed by one patterning process.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
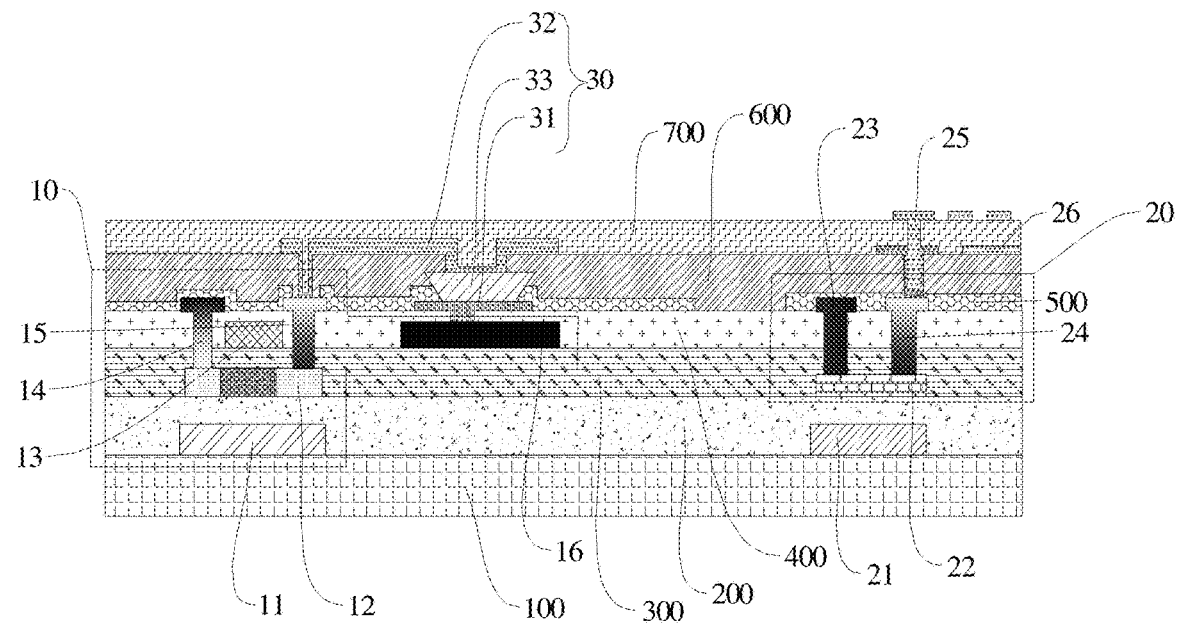
FIG. 1 is a schematic structural view of an array substrate of an embodiment of the present disclosure.

An embodiment of the present disclosure provides an array substrate. Referring to FIG. 1, the array substrate comprises: a base substrate 100 having a first TFT region, a second TFT region, and a touch region; and a photosensitive PN junction 30, disposed in the touch region; a first thin film transistor 10, disposed in the first TFT region and electrically connected to the photosensitive PN junction 30; and a second film transistor 20, disposed in the second TFT region and electrically connected to a pixel electrode 25. A photosensitive PN junction structure is integrated to the array substrate in order to have both of the touch and display functions, and the photosensitive PN junction structure is integrated onto the array substrate, in order to be capable of simplifying the product structure and manufacture steps, and reducing the product thickness, which complies with the trend of being thinner and lighter.

According to an embodiment of the present disclosure, the first thin film transistor is a low temperature polysilicon thin film transistor, and the second thin film transistor is an oxide thin film transistor. Therefore, the low-temperature polysilicon thin film transistor and the oxide thin film transistor are respectively configured as the touch and display switches of the photosensitive PN junction, and the two thin film transistors with different functions are integrated together, so that the array substrate has both of the touch and display functions. The LTPS TFT has a high mobility and is effective as a touch switch, and has high sensitivity; the Oxide TFT has a low leakage current and thus leads to a good display effect.

According to an embodiment of the present disclosure, the specific structures of the first thin film transistor, the second thin film transistor, and the photosensitive PN junction are not particularly limited, and can have the structures of a conventional low temperature polysilicon thin film transistor, a conventional oxide thin film transistor, and a conventional PN junction in the art. In some embodiments of the present disclosure, in order to integrate the first thin film transistor, the second thin film transistor, and the photosensitive PN junction on the array substrate, a common structure of the two thin film transistors and the photosensitive PN junction can be utilized. For example, referring to FIG. 1, the first thin film transistor 10 can comprise a light shield layer 11, a gate electrode 12, an active layer 13, a source electrode 14, a drain electrode 15, and the like; the second thin film transistor 20 can comprise a gate electrode 21, an active layer 22, a source electrode 23, a drain electrode 24, and the like; the photosensitive PN junction 30 can comprise a first electrode 31, a second electrode 32, and a PIN structure 33, as well as a first common electrode 16, a second common electrode 26, a pixel electrode 25, a first insulation layer 200, a second insulation layer 300, a third insulation layer 400, a fourth insulation layer 500, a resin layer 600, and a passivation layer 700 disposed between the layer structures.

For example, the array substrate comprises a base substrate 100, the light shield layer 11 disposed on a side of the base substrate 100 and located in the first TFT region; the second gate electrode 21 disposed on the same side of the base substrate 100 as the light shield layer 11 and located in the second TFT region; the first insulation layer 200 disposed on a side of the base substrate 100 and covering the light shield layer 11 and the second gate electrode 21, a portion of the first insulation layer 200 located in the first TFT region constituting a buffer layer of the first thin film transistor, and a portion of the first insulation layer located in the second TFT region constituting a gate insulation layer of the second thin film transistor; a first active layer 12 disposed on a side of the first insulation layer 200 away from the base substrate 100 and located in the first TFT region; a second active layer 22 disposed on a side of the first insulation layer 200 away from the base substrate 100 and located in the second TFT region; a second insulation layer 300 disposed on a side of the first insulation layer 200 away from the base substrate 100 and covering the first active layer 12 and the second active layer 22, a portion of the second insulation layer located in the first TFT region constituting a gate insulation layer of the first thin film transistor, and a portion of the second insulation layer located in the second TFT region constituting an etch stop layer of the second thin film transistor; the first gate electrode 13 disposed on a side of the second insulation layer 300 away from the base substrate 100 and located in the first TFT region; the first common electrode 16, disposed on a side of the second insulation layer 300 away from the second insulation layer 300 and located in the touch region, to be electrically connected to the first electrode of the photosensitive PN junction for conducting a electrical signal; the third insulation layer 400 disposed on a side of the second insulation layer 300 away from the base substrate 100 and covering the first gate electrode 13 and the first common electrode 16; the first source electrode 14 and the first drain electrode 15 disposed on a side of the third insulation layer 400 away from the base substrate 100 and located in the first TFT region, and electrically connected to the first active layer 12; the first electrode 31 disposed on a side of the third insulation layer 400 away from the base substrate 100, located in the touch region, and electrically connected to the first common electrode 16; the second source electrode 23 and the second drain electrode 24, disposed on the third insulation layer 400 far away from the base substrate 100, located in the second TFT layer, and electrically connected to the second active layer 22; the fourth insulation layer 500, disposed on a side of the third insulation layer 400 away from the base substrate 100, and covering a portion of the first source electrode 14, a portion of the first drain electrode 15, a portion of the first electrode 31, a portion of the second source electrode 23 and the second drain electrode 24; the PIN structure 33, be capable of comprising an N+ semiconductor layer disposed on a side of the first electrode 31 away from the base substrate 100 and located in the touch region; an intrinsic semiconductor layer, disposed on a side of a N+ semiconductor layer away from the base substrate 100 and located in the touch region; a P+ semiconductor layer, disposed on a side of the intrinsic semiconductor layer away from the base substrate 100 and located in the touch region; the resin layer 600, disposed on a side of the fourth insulation layer 500 away from the base substrate 100; the second electrode 32, disposed on a side of the P+ semiconductor layer away from the base substrate 100 and extending to the first drain electrode 15, to be electrically connected to the first drain electrode 15; the pixel electrode 25, disposed on a side of the resin layer 600 away from the base substrate 100, located in the second TFT region, and electrically connected to the second drain electrode 24; the second common electrode 26, disposed on a side of the resin layer 600 away from the base substrate 100, located in the second TFT region, and functioning as a common electrode for the display function; the passivation layer 700, disposed on a side of the resin layer 600 away from the base substrate 100 and covering the second electrode 32 and the second common electrode 26. The first thin film transistor 10, the second thin film transistor 20 and the photosensitive PN junction 30 can share structures, and different structures can be disposed in the same layer, thereby better integrating the touch function on the array substrate, simplifying the product structure and steps and lowering the production cost.

Figure 2:
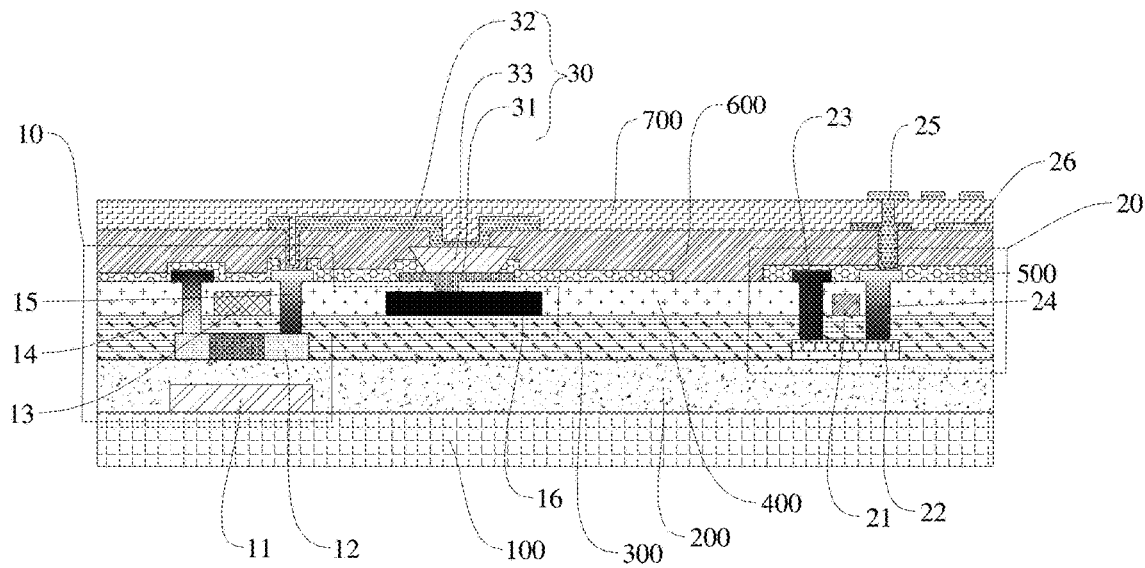
FIG. 2 is a schematic structural view of an array substrate of another embodiment of the present disclosure.
Figure 18:
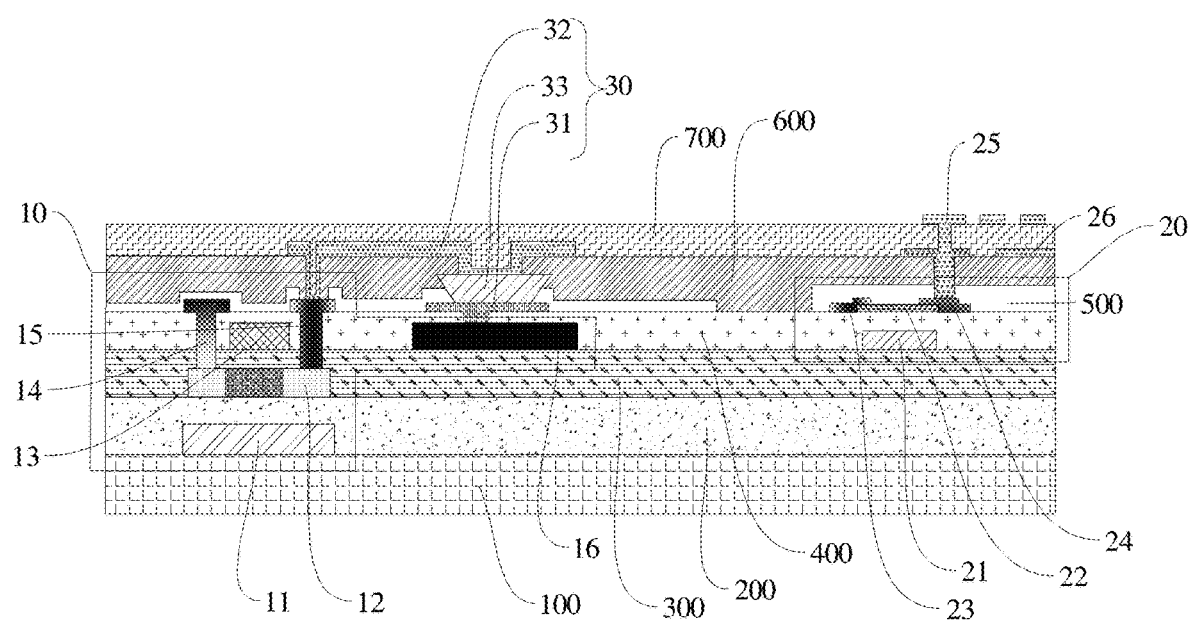
FIG. 18 is a schematic structural view of an array substrate of another embodiment of the present disclosure.

It should be understood by those skilled in the art that FIG. 1 is only for exemplifying the structure of the array substrate of the present disclosure, and is not to be construed as limiting the disclosure, and that reasonable changes and substitutions made on it are within the protection scope of the present disclosure. For example, in some embodiments of the present disclosure, referring to FIG. 2, the second gate electrode 21 of the second thin film transistor can be disposed on a side of the second insulation layer 300 away from the base substrate 100, and disposed in the same layer as the first gate electrode 13 and the first common electrode 16, and the other structures are the same as those shown in FIG. 1. In still other embodiments of the present disclosure, referring to FIG. 18, the second gate electrode 21 of the second thin film transistor can be disposed on a side of the second insulation layer 300 away from the base substrate 100 and disposed in the same layer as the first gate electrode 13 and the first common electrode 16, and the second active layer 22 is disposed on a side of the third insulation layer 400 away from the base substrate 100.

Another embodiment of the present disclosure provides a touch display apparatus comprising the array substrate described in the above embodiments. The touch structure and the display structure of the touch display apparatus are integrated on the array substrate, and the product structure and the manufacture steps are simple, and the thickness is thin, which complies with the trend of being lighter and thinner. In addition, those skilled in the art can understand that the touch display apparatus has all the features and advantages of the array substrate described in the above embodiments, and details are not described herein again.

A further embodiment of the present disclosure provides a manufacture method of an array substrate, comprising: forming a first thin film transistor in a first TFT region of a base substrate; forming a photosensitive PN junction in a touch region of the base substrate; forming a second thin film transistor in the second TFT region of the base substrate; wherein the first thin film transistor is electrically connected to the photosensitive PN junction; and the second thin film transistor is electrically connected to a pixel electrode. By this method, the photosensitive PN can be integrated to dispose on the array substrate, so that the array substrate has both of the touch and display functions at the same time, and the manufacture steps are simple, convenient, and low in cost.

According to an embodiment of the present disclosure, the specific structures of the first thin film transistor, the second thin film transistor, and the photosensitive PN junction can be identical to those described above, and will not be further described herein. According to an embodiment of the present disclosure, in order to simplify the steps and the product structure, and at the same time better integrate the first thin film transistor, the second thin film transistor and the photosensitive PN junction, the inventors make full use of the common structures and manufacture steps of them, which not only simplifies the process but also reduces the manufacture cost. For example, referring to FIGS. 1 and 3-17, the manufacture method of the array substrate according to an embodiment of the present disclosure can comprise the following steps.

Figure 3:
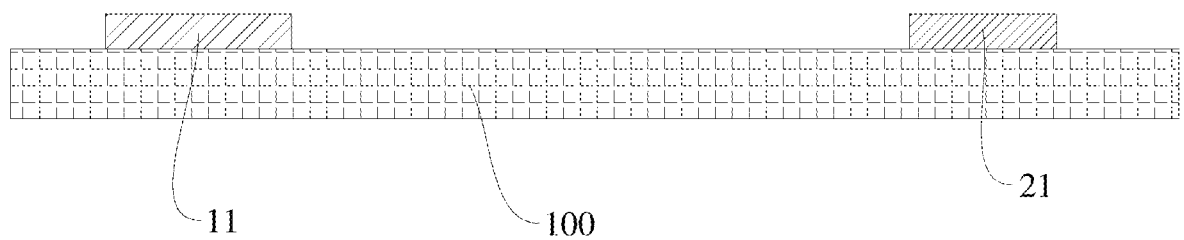
FIGS. 3 to 17 are schematic process views of a manufacture method of an array substrate in still another embodiment of the present disclosure.

Referring to FIG. 3, the light shield layer 11 of the first thin film transistor and the second gate electrode 21 of the second thin film transistor are formed on a side of the base substrate 100 by one patterning process. The light shield layer 11 of the first thin film transistor and the second gate electrode 21 of the second thin film transistor are deposited and formed by a mask at the same time. For example, the entire metal layer can be deposited, and then the metal layer can be patterned, that is, steps of coating photoresist, exposing, developing, etching, and removing the photoresist to form the first light shield layer 11 and the second gate electrode 21. According to an embodiment of the present disclosure, the material for forming the metal layer is not particularly limited, provided that the light shield requirement and the conductivity requirement are satisfied, including but not limited to Al, Mo, AlNd, Cu, MoNb, or a combination thereof. The thickness of the metal layer is not particularly limited, and for example, it can be controlled in a range of 3,000 to 5,000 Å, thereby having a better effect.

Figure 4:
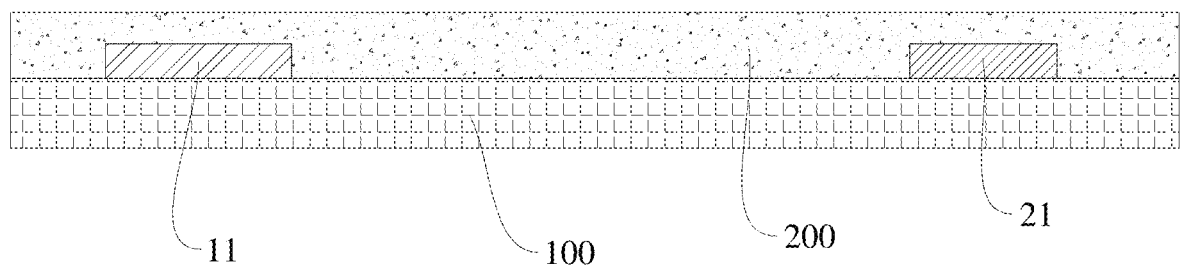

According to an embodiment of the present disclosure, referring to FIG. 4, then, the first insulation layer 200 can be formed on a base substrate, the first insulation layer 200 covers the light shield layer 11 and the second gate electrode 21, and a portion of the first insulation layer located in the first TFT region constitutes a buffer layer of the first thin film transistor, and a portion of the first insulation layer located in the second TFT region constitutes a gate insulation layer of the second thin film transistor. Thus, the first thin film transistor and the second thin film transistor can share the structure sufficiently, and can be manufactured by one process, which reduces the process steps and reduces the manufacture cost.

According to an embodiment of the present disclosure, a specific method of forming the first insulation layer is not particularly limited, and the first insulation layer can be formed, for example, by deposition of PECVD method. The material for forming the first insulation layer is not particularly limited and comprises, but is not limited to, a SiNx/SiO2 film layer, whereby the film layer can simultaneously have the functions of a buffer layer and a gate insulation layer. The thickness of the first insulation layer is also not particularly limited, and those skilled in the art can flexibly select it according to requirements. For example, the thickness of the first insulation layer can be controlled in a range of 3,000 to 4,000 Å. Thus, it would not be too thin to cause bad performance, and it is not too thick to increase the thickness of the array substrate or waste material.

Figure 5:
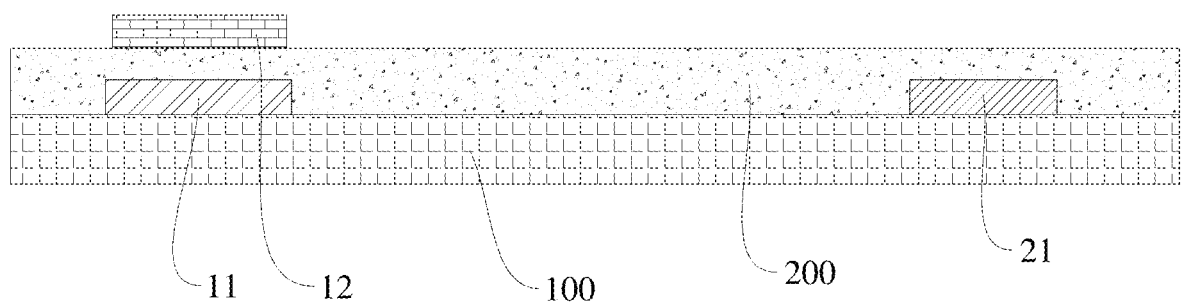

According to an embodiment of the present disclosure, referring to FIG. 5, the first active layer 12 of the first thin film transistor is then deposited. An active layer formed by low-temperature polysilicon is illustrated as an example. An amorphous silicon layer can be firstly deposited, and then crystallization is performed by an ELA process, and the thickness can be controlled between 400 and 500 Å; the active layer 12 is etched by the photolithography process.

Figure 6:
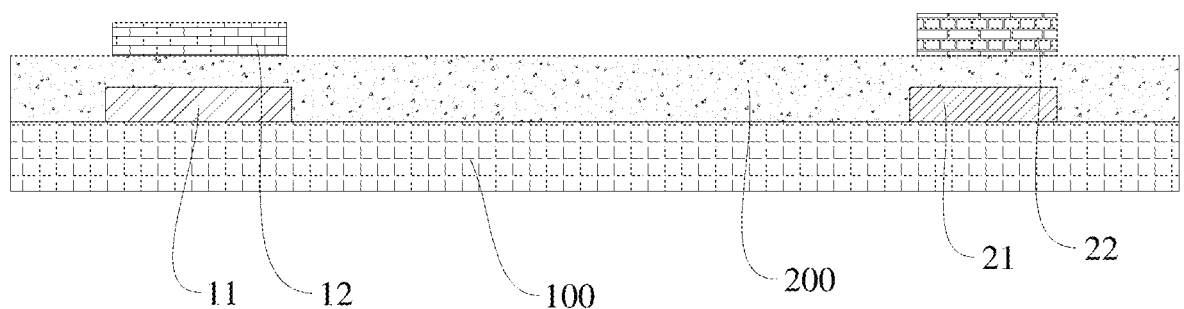

According to an embodiment of the present disclosure, referring to FIG. 6, then the second active layer 22 of the second thin film transistor can be manufactured. The IGZO active layer is illustrated as an example. The steps of deposition and photolithography can be sequentially performed to form the second active layer. The thickness of the second active layer can be controlled in a range of 400-700 Å, and the content of O2 is adjusted between 20% and 30% during the deposition. Thereby, the second active layer having better performance can be obtained.

Figure 7:
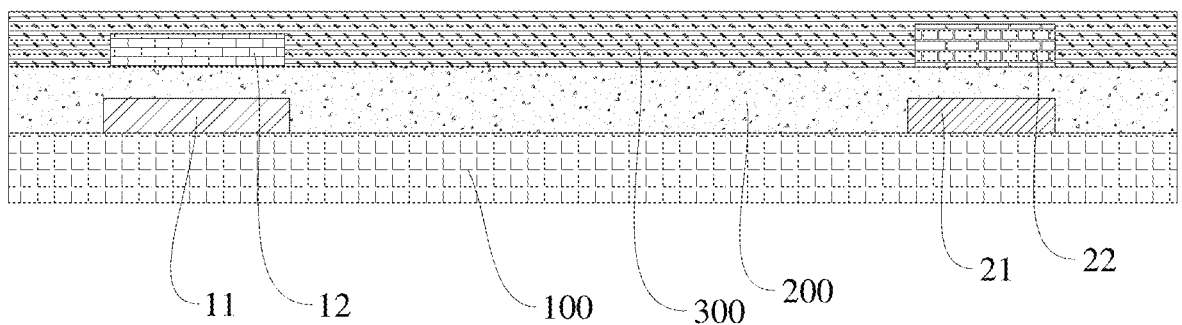

According to an embodiment of the present disclosure, referring to FIG. 7, the second insulation layer 300 is then formed on a side of the first insulation layer away from the base substrate. The second insulation layer 300 covers the first active layer 12 of the first thin film transistor and the second active layer 22 of the second thin film transistor, and a portion of the second insulation layer located in the first TFT region constitutes a gate insulation layer of the first thin film transistor, and a portion of the second insulation layer located in the second TFT region constitutes an etch stop layer of the second thin film transistor.

According to an embodiment of the present disclosure, the method of forming the second insulation layer is not particularly limited, and comprises, but is not limited to, a PECVD method. In a specific process, the thin film process can be integrated according to the use requirements of the gate insulation layer and the etch stop layer, to meet characteristics of the two types of the thin film transistors. For example, the power, the spacing between substrates, the pressure, and the flow rate and ratio of gases can be adjusted. Thereby, the second insulation layer can simultaneously satisfy the characteristics of the two thin film transistors, simplifying the structure and manufacture steps, and reducing the production cost.

Figure 8:
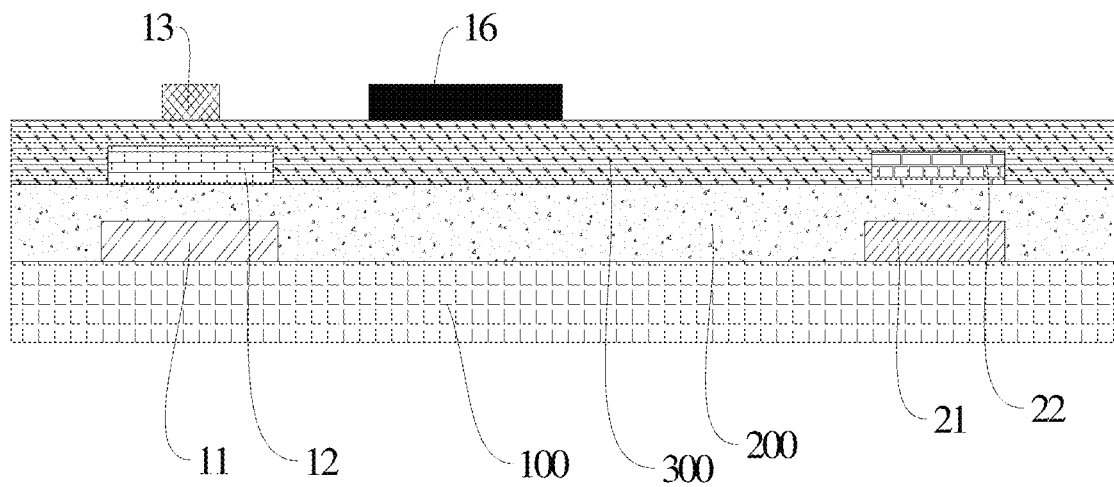

According to an embodiment of the present disclosure, referring to FIG. 8, then the first gate electrode 13 of the first thin film transistor and the first common electrode 16 are manufactured. According to an embodiment of the present disclosure, the specific method of forming is not particularly limited, and comprises, for example, but not limited to, depositing a metal layer by a magnetron sputtering device, and exposing through a mask to etch to form the first gate electrode 13 and the first common electrode 16. The material for forming the metal layer is also not particularly limited, and can be Al, Mo, AlNd, Cu, MoNb, or the like, or a combination of two of them, and the thickness can be controlled in a range of 3,000 to 5,000 Å. Moreover, the first common electrode 16 can simultaneously be configured as a lower electrode of the sensing component of the photosensitive PN junction for conducting an electrical signal. Thereby, the multiplexing of the same structure is achieved, and the structure and the manufacture steps of the array substrate are simplified while integrating the touch function on the array substrate.

Figure 9:
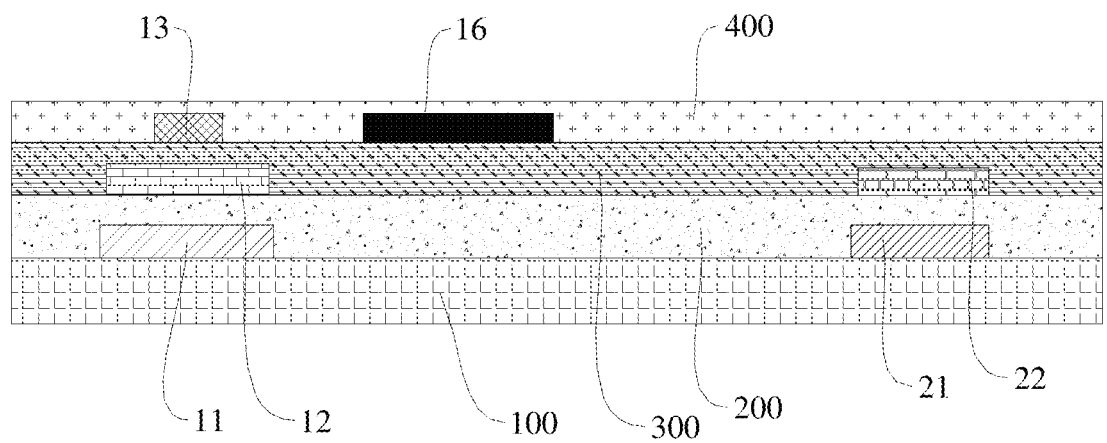

According to an embodiment of the present disclosure, referring to FIG. 9, the manufacture method of the array substrate further comprises a step of forming the third insulation layer 400 on a side of the second insulation layer 300 away from the base substrate 100, with the third insulation layer 400 covering the first gate electrode 13 and the first common electrode 16, and a portion of the third insulation layer located in the first TFT region constituting an interlayer insulation layer of the first thin film transistor.

According to an embodiment of the present disclosure, the specific forming method, material, and thickness of the second insulation layer are not particularly limited, and can be flexibly selected by those skilled in the art as requirements. In some embodiments of the present disclosure, the second insulation layer can be formed by a deposition method, the thickness of the second insulation layer can be 1000-2000 Å, and the forming material can be a combination of SiO/SiON or the like.

Figure 10:
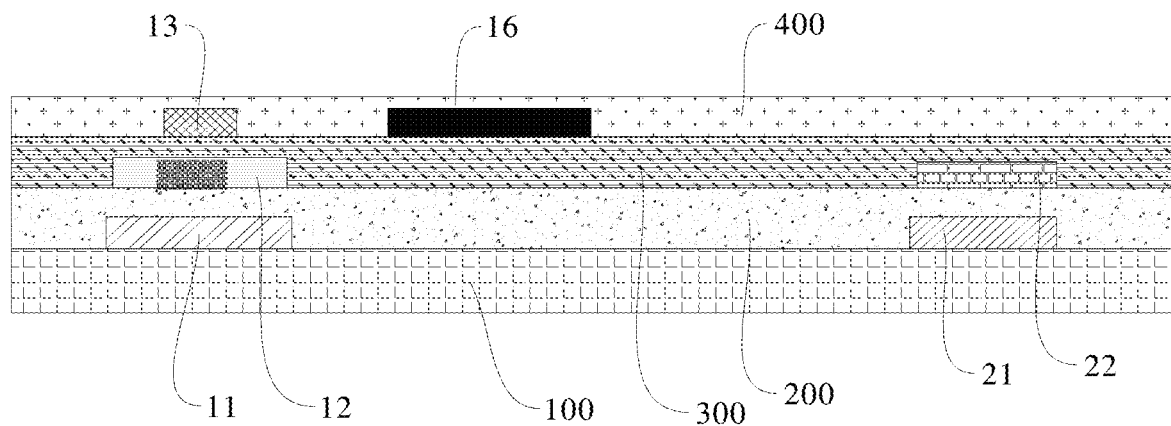
Figure 11:
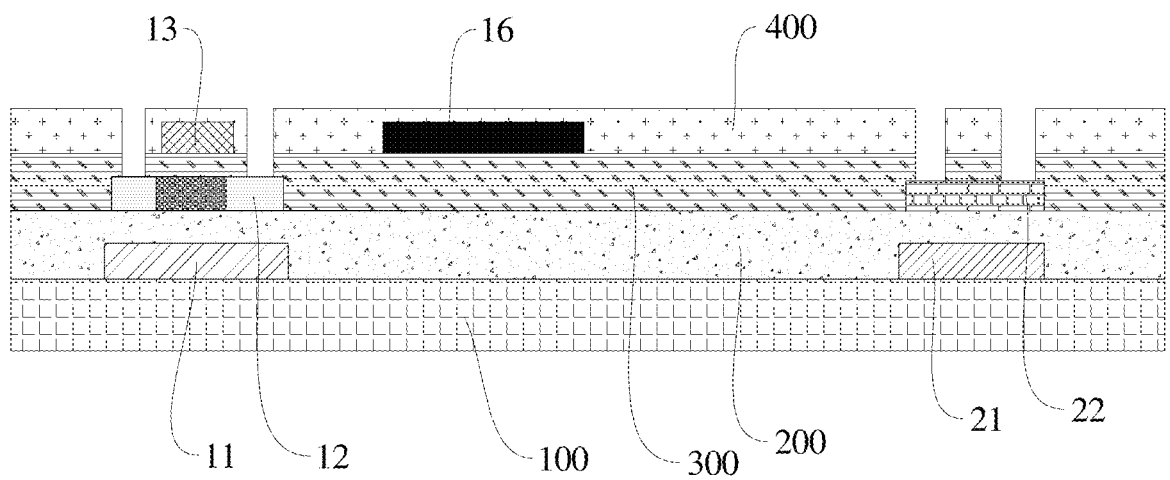

According to an embodiment of the present disclosure, referring to FIG. 10, a first active layer N+ doping process can be performed such that the first source electrode and the first drain electrode are conducted with the active layer to form an ohmic contact layer. Thereby, the display effect and the use performance of the display device can be further improved. Next, referring to FIG. 11, a step of via hole etch can be performed. A specific etch method can be flexibly selected by a person skilled in the art according to requirements, for example, a via hole can be formed by a dry etching process. Thus, the steps are simple and the process is mature.

Figure 12:
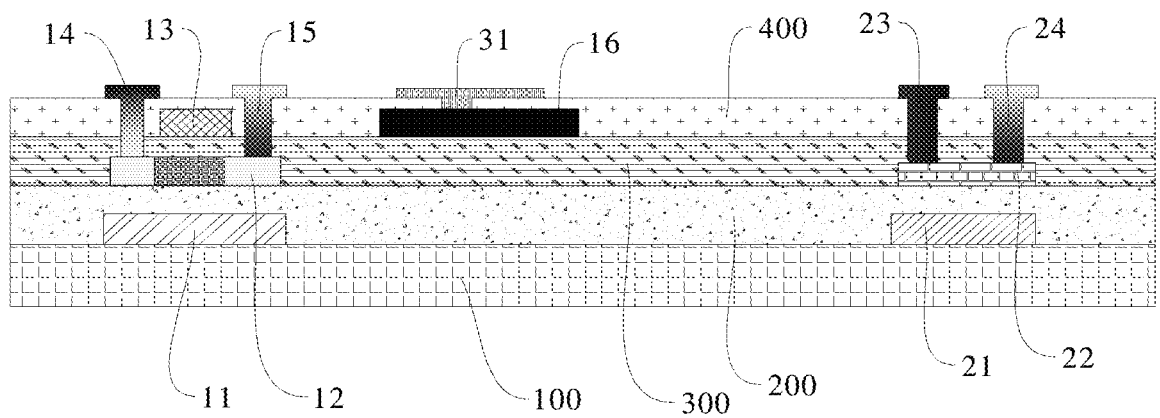

According to an embodiment of the present disclosure, referring to FIG. 12, the first electrode 31 of the photosensitive PN junction, the first source electrode 14 and the first drain electrode 15 of the first thin film transistor, the second source electrode 23 and the second drain electrode 24 of the second thin film transistor are formed on a side of the third insulation layer 400 away from the base substrate 100. According to an embodiment of the present disclosure, the specific forming method is not particularly limited. For example, a metal layer can be deposited by a magnetron sputtering device, and then exposed through a mask to etch the electrode lines. The metal can be Al, Mo, AlNd, Cu, MoNb, etc. or a combination of two of them, or the thickness of the metal layer can be controlled in a range of 3000-5000 Å.

Figure 13:
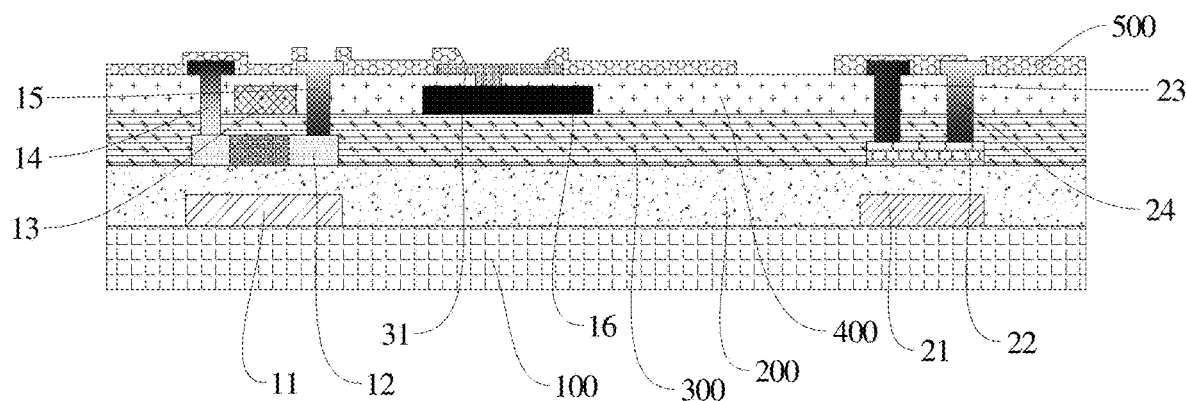

According to an embodiment of the present disclosure, referring to FIG. 13, the fourth insulation layer 500 is disposed on a side of the third insulation layer 400 away from the base substrate 100, and the fourth insulation layer 500 covers the first source electrode 14 and the first drain electrode 15, the first electrode 31, the second source electrode 23, and the second drain electrode 24. For example, the fourth insulation layer 500 can be formed by a deposition method, the thickness of the fourth insulation layer 500 can be 1000-2000 Å, and the forming material can be a combination of SiO/SiON, etc. Further, referring to FIG. 12, it is also required to be etched by photolithography and etching process to have a via hole for connecting the first source electrode 15, the second source electrode 24, and the first electrode 31 with other electrodes.

Figure 14:
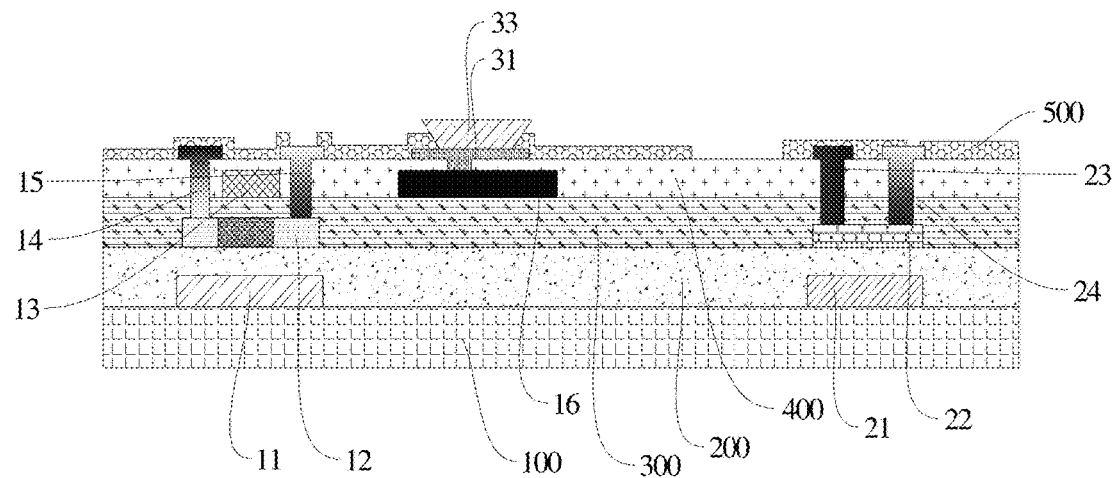

According to an embodiment of the present disclosure, referring to FIG. 14, then the photosensitive PN junction controlled by the first thin film transistor is manufactured. For example, the N+ semiconductor layer, the intrinsic semiconductor layer, and the P+ semiconductor layer can be deposited by one process to form a PIN structure. In one example of the present disclosure, the following steps can be performed: depositing phosphine-doped amorphous silicon to form an N+ layer with a thickness of 500-800 Å, which deposition conditions can be Power: 300 W, Space (substrate spacing): 1000 mil, P (pressure): 1230 mt, H2/PH3/SiH4: 1250/250/190 sccm, t: 62 S, T: 250° C.; then depositing an amorphous silicon semiconductor layer with a thickness of 8000-10000 Å, which deposition conditions can be Power: 150 W, Space: 750 mil, P: 1500 mt, H2/SiH4: 1000/190 sccm, t: 1104 S; T: 250° C.; depositing borane-doped amorphous silicon to form a P+ semiconductor layer with a thickness of 500-800 Å, which deposition conditions can be Power: 550 W, Space: 1000 mil, P: 1230 mt, B2H6/H2/SiH4: 500/750/190 sccm, t: 30 S, T: 250° C.; then performing exposure and development and dry etching processes to obtain a PIN pattern 33.

Figure 15:
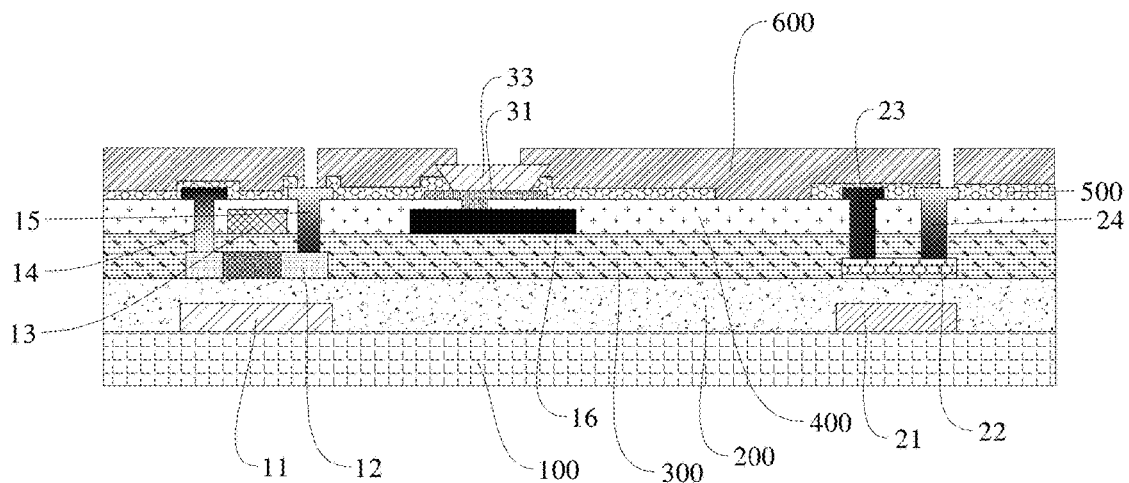

According to an embodiment of the present disclosure, referring to FIG. 15, then the resin layer 600 is manufactured. For example, the resin layer 600 can be formed by a deposition method, and the thickness of the resin layer can be controlled at 1.7 μm while exposing and ashing to form an ITO-lapped organic film via hole for subsequent steps.

Figure 16:
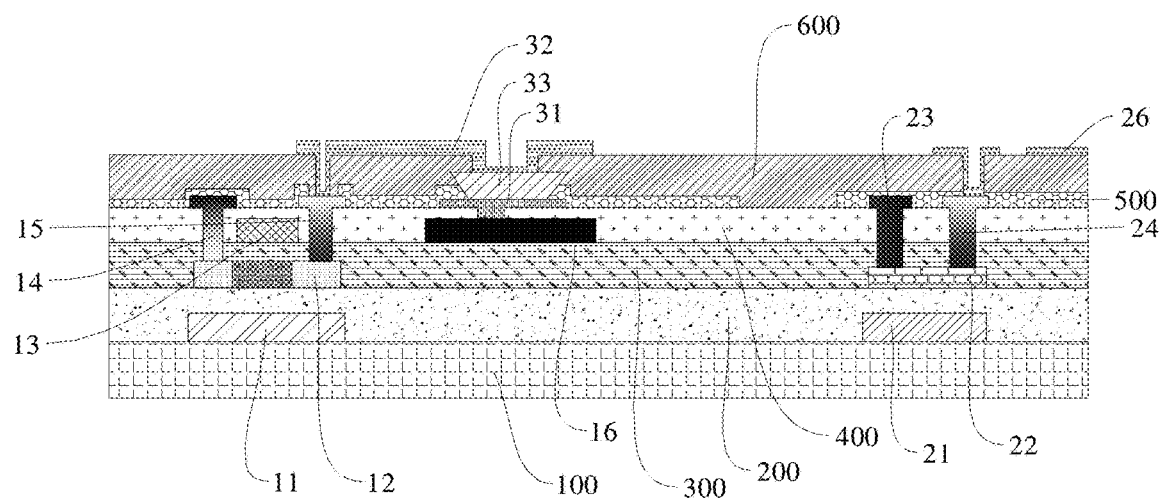

According to an embodiment of the present disclosure, referring to FIG. 16, the second electrode 32 of the photosensitive PN junction and the second common electrode 26 of the second thin film transistor are then formed by one patterning process. In some embodiments of the present disclosure, the ITO metal can be deposited by using a magnetron sputtering device, and the thickness of the ITO metal can be controlled in a range of 400-700 Å, and the exposure, the development, and the etching processes are performed to etch the electrode pattern. It should be noted that the electrode pattern formed by the one patterning process and connected to the drain electrode 24 is not conducted with the second common electrode 26, and is only configured to electrically connect the drain electrode 24 with the pixel electrode 25.

Figure 17:
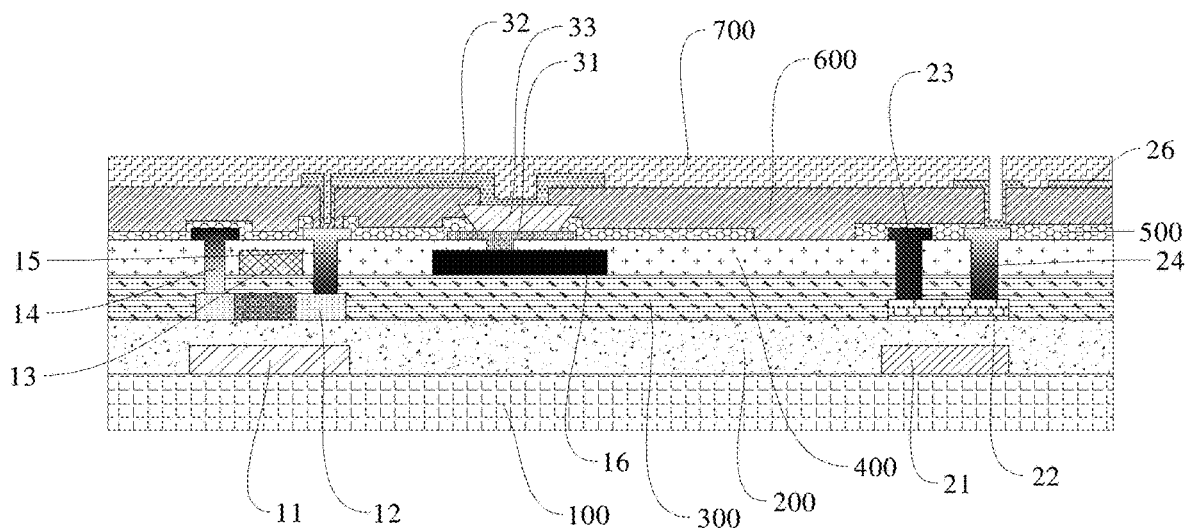

According to an embodiment of the present disclosure, referring to FIG. 17, then the passivation layer 700 is deposited, and the material for forming the passivation layer can be a SiNx/SiO$_2$ film layer, and the thickness of the passivation layer can be controlled in a range of 3000 to 4000 Å, and a connection via hole is etched.

According to an embodiment of the present disclosure, referring to FIG. 1, then the pixel electrode 25 of the second thin film transistor is manufactured. For example, the ITO layer can be deposited, and then the pixel electrode 25 is etched after exposure and development.

By the method of the above embodiment of the present disclosure, the second thin film transistor such as a low temperature polysilicon thin film transistor and the second thin film transistor such as an oxide thin film transistor can be manufactured in the same array substrate to be configured as touch switches for a display switch and a photosensitive PN junction, respectively. The thin film transistors with two different functions are integrated together, so that the array substrate has both of the touch and display functions, and at the same time, the masks which can be shared by the two processes is utilized in the manufacture process, and the number of the masks is reduced and thus the manufacture cost is reduced and a new type of display apparatus is manufactured.

Of course, those skilled in the art can understand that the above specific manufacture steps are only for exemplifying the technical solutions of the present disclosure, and are not to be understood as the limitations to the present disclosure, and reasonable changes and substitutions made on the basis of the present disclosure are all within the protection scope of the present disclosure. For example, corresponding to the structures of FIG. 2 and FIG. 18, the sequence of different steps can be adjusted on the basis of the above specific manufacture steps to obtain array substrates with different structures.

What are described above is related to the illustrative embodiments of the disclosure only and not limitative to the scope of the disclosure; the scopes of the disclosure are defined by the accompanying claims.

The invention claimed is:

1. An array substrate comprising:
    a base substrate, having a first TFT region, a touch region, and a second TFT region;
    a PN junction, disposed in the touch region;
    a first thin film transistor, disposed in the first TFT region and electrically connected to the PN junction; and
    a second thin film transistor, disposed in the second TFT region and electrically connected to a pixel electrode,
    wherein a second gate electrode of the second thin film transistor and a light shield layer of the first thin film transistor are located in a same layer; or
    the second gate electrode of the second thin film transistor and a first common electrode as well as a first gate electrode of the first thin film transistor are located in a same layer.

2. The array substrate of claim 1, wherein the first thin film transistor is a low temperature polysilicon thin film transistor, and the second thin film transistor is an oxide thin film transistor.

3. A touch display apparatus, comprising the array substrate of claim 1.

4. A manufacturing method of an array substrate, comprising:
    forming a first thin film transistor in a first TFT region of a base substrate;
    forming a photosensitive PN junction in a touch region of the base substrate;
    forming a second thin film transistor in a second TFT region of the base substrate;
    wherein the first thin film transistor is electrically connected to the photosensitive PN junction; the second thin film transistor is electrically connected to the pixel electrode,
    wherein a second gate electrode of the second thin film transistor and a light shield layer of the first thin film transistor are formed by one patterning process and are located on a side of the base substrate; or
    the second gate electrode of the second thin film transistor and a first common electrode as well as a first gate electrode of the first thin film transistor are formed by one patterning process and are located on a side of the base substrate.

5. The method of claim 1, further comprising: forming a first insulation layer on the base substrate, wherein the first insulation layer covers the light shield layer and the second gate electrode, a portion of the first insulation layer located in the first TFT region constitutes a buffer layer of the first thin film transistor, and a portion of the first insulation layer located in the second TFT region constitutes a gate insulation layer of the second thin film transistor.

6. The method of claim 5, further comprising: forming a second insulation layer on a side of the first insulation layer away from the base substrate, wherein the second insulation layer covers a first active layer of the first thin film transistor and a second active layer of the second thin film transistor, and a portion of the second insulation layer located in the first TFT region constitutes a gate insulation layer of the first thin film transistor, and a portion of the second insulation layer located in the second TFT region constitutes an etch stop layer of the second thin film transistor.

7. The method of claim 6, further comprising: forming a third insulation layer on a side of the second insulation layer away from the base substrate, wherein the third insulation layer covers the first gate electrode of the first thin film transistor and the first common electrode, and a portion of the third insulation layer located in the first TFT region constitutes an interlayer insulation layer of the first thin film transistor.

8. The method of claim 7, wherein a first electrode of the photosensitive PN junction, a first source electrode and a first drain electrode of the first thin film transistor, and a second source electrode and a second drain electrode of the second thin film transistor are formed by one patterning process and are located on a side of the third insulation layer away from the base substrate.

9. The method of claim 8, wherein a second electrode of the photosensitive PN junction and a second common electrode are formed by one patterning process.

10. The array substrate of claim 1, further comprising a first insulation layer on the base substrate, wherein the first insulation layer covers the light shield layer and the second gate electrode, a portion of the first insulation layer located in the first TFT region constitutes a buffer layer of the first thin film transistor, and a portion of the first insulation layer located in the second TFT region constitutes a gate insulation layer of the second thin film transistor.

11. The array substrate of claim 10, further comprises a second insulation layer on a side of the first insulation layer away from the base substrate, wherein the second insulation layer covers a first active layer of the first thin film transistor and a second active layer of the second thin film transistor, and a portion of the second insulation layer located in the first TFT region constitutes a gate insulation layer of the first thin film transistor, and a portion of the second insulation layer located in the second TFT region constitutes an etch stop layer of the second thin film transistor.

12. The array substrate of claim 11, further comprising a third insulation layer on a side of the second insulation layer away from the base substrate, wherein the third insulation layer covers the first gate electrode of the first thin film transistor and the first common electrode, and a portion of the third insulation layer located in the first TFT region constitutes an interlayer insulation layer of the first thin film transistor.

13. The array substrate of claim 12, wherein a first electrode of the photosensitive PN junction, a first source electrode and a first drain electrode of the first thin film transistor, and a second source electrode and a second drain electrode of the second thin film transistor are located in a same layer.

* * * * *